US012419136B2

United States Patent
Ye et al.

(10) Patent No.: US 12,419,136 B2
(45) Date of Patent: Sep. 16, 2025

(54) ULTRATHIN SILICON OXYNITRIDE INTERFACE MATERIAL, TUNNEL OXIDE PASSIVATED STRUCTURE AND PREPARATION METHODS AND APPLICATIONS THEREOF

(71) Applicant: Teranergy Technology Co., Ltd., Ningbo (CN)

(72) Inventors: Jichun Ye, Ningbo (CN); Yuheng Zeng, Ningbo (CN); Haiyang Xing, Ningbo (CN); Dian Ma, Ningbo (CN); Wei Liu, Ningbo (CN); Baojie Yan, Ningbo (CN); Mingdun Liao, Ningbo (CN)

(73) Assignee: TERANERGY TECHNOLOGY CO., LTD., Ningbo (CN)

( * ) Notice: Subject to any disclaimer, the term of this patent is extended or adjusted under 35 U.S.C. 154(b) by 0 days.

(21) Appl. No.: 18/884,233

(22) Filed: Sep. 13, 2024

(65) Prior Publication Data

US 2025/0006850 A1    Jan. 2, 2025

Related U.S. Application Data

(63) Continuation of application No. PCT/CN2022/113247, filed on Aug. 18, 2022.

(30) Foreign Application Priority Data

Mar. 23, 2022    (CN) .......................... 202210368180.3

(51) Int. Cl.
*H10F 77/30*    (2025.01)
*C23C 8/12*    (2006.01)
(Continued)

(52) U.S. Cl.
CPC .............. *H10F 77/311* (2025.01); *C23C 8/12* (2013.01); *C23C 16/24* (2013.01); *C23C 16/308* (2013.01);
(Continued)

(58) Field of Classification Search
CPC .............. H01L 31/1804; H01L 31/182; H01L 31/03682; H01L 31/0288; H01L 31/02167;
(Continued)

(56) References Cited

U.S. PATENT DOCUMENTS

| | | | |
|---|---|---|---|
| 2015/0194539 A1* | 7/2015 | Shepherd ............ | H01L 31/1804 438/57 |
| 2018/0114871 A1* | 4/2018 | Lin ..................... | H01L 31/0747 |
| 2020/0075789 A1* | 3/2020 | Löper .................. | H10F 71/103 |

FOREIGN PATENT DOCUMENTS

| | | |
|---|---|---|
| CN | 105742391 A | 7/2016 |
| CN | 108447918 A | 8/2018 |

(Continued)

OTHER PUBLICATIONS

CN 105742391A English machine translation (Year: 2016).*
(Continued)

*Primary Examiner* — Andrew J Golden
(74) *Attorney, Agent, or Firm* — Bayramoglu Law Offices LLC

(57) ABSTRACT

An ultrathin silicon oxynitride interface material, a tunnel oxide passivated structure and preparation methods and applications thereof are provided. The ultrathin silicon oxynitride interface material is an SiON film with a thickness of 1 nm to 4 nm, and the percentage content of N atoms is 1% to 40%. Compared with silicon oxide, the diffusion rate of boron in the SiON film of the present disclosure is low, which effectively reduces the damaging effect of boron,
(Continued)

improves the integrity of the SiON film and maintains the chemical passivation effect. The SiON film with high nitrogen concentration can noticeably lower the concentration of boron on the silicon surface so as to lessen the boron-induced defects. Furthermore, the SiON film has an energy band structure approximate to silicon nitride, which increases the hole transport efficiency and hole selectivity, and further improves the passivation quality and reduces the contact resistivity.

8 Claims, 1 Drawing Sheet

(51) Int. Cl.
    *C23C 16/24* (2006.01)
    *C23C 16/30* (2006.01)
    *C23C 16/50* (2006.01)
    *C23C 16/56* (2006.01)
    *H10F 71/00* (2025.01)
    *H10F 77/1223* (2025.01)
    *H10F 77/164* (2025.01)

(52) U.S. Cl.
    CPC .............. *C23C 16/50* (2013.01); *C23C 16/56* (2013.01); *H10F 71/1221* (2025.01); *H10F 71/128* (2025.01); *H10F 77/1223* (2025.01); *H10F 77/1642* (2025.01)

(58) Field of Classification Search
    CPC ....... H01L 31/074–0747; H10F 77/311; H10F 77/1223; H10F 77/1642; H10F 71/128; H10F 71/122; C23C 8/12; C23C 16/24; C23C 16/308; C23C 16/50; C23C 16/56
    See application file for complete search history.

(56) References Cited

FOREIGN PATENT DOCUMENTS

| | | |
|---|---|---|
| CN | 111509081 A | 8/2020 |
| CN | 112186067 A | 1/2021 |
| CN | 114843350 A | 8/2022 |

OTHER PUBLICATIONS

He Su-Ming, et al., Preparation of SiON film by plasma enhanced chemical vapor deposition and passivation on Si, Acta Phys. Sin., 2014, pp. 128102-1-128102-7, vol. 63, No. 12.

Stefan W. Glunz, et al., Silicon-based passivating contacts: The TOPCon route, Prog Photovolt Res Appl., 2021, pp. 1-19.

Yi-Sheng Lai, et al., Evolution of chemical bonding configuration in ultrathin SiOxNy layers grown by low-temperature plasma nitridation, Journal of Vacuum Science & Technology A, 2003, pp. 772-778, vol. 21 No. 3.

\* cited by examiner

ULTRATHIN SILICON OXYNITRIDE INTERFACE MATERIAL, TUNNEL OXIDE PASSIVATED STRUCTURE AND PREPARATION METHODS AND APPLICATIONS THEREOF

CROSS REFERENCE TO THE RELATED APPLICATIONS

This application is a continuation application of International Application No. PCT/CN2022/113247, filed on Aug. 18, 2022, which is based upon and claims priority to Chinese Patent Application No. 202210368180.3, filed on Mar. 23, 2022, the entire contents of which are incorporated herein by reference.

TECHNICAL FIELD

The present disclosure relates to the technical field of solar cells, and in particular to an ultrathin silicon oxynitride (SiON) interface material, a tunnel oxide passivated structure and preparation methods and applications thereof.

BACKGROUND

The Tunnel Oxide Passivated Contact (TOPCon) solar cell is a novel crystalline silicon solar cell proposed by German Fraunhofer in 2013, where the N-type cells feature the typical structure as shown in FIG. 1. The core of such structures is that an ultrathin silicon oxide layer and a doped polycrystalline silicon laminated structure are used to passivate the silicon wafer surfaces. The passivation mechanism of the tunnel silicon oxide passivated contact structure mainly comes from two aspects: one aspect is the chemical passivation effect of the interfacial silicon oxide layer, and the second is the field passivation effect of the doped atoms. Therefore, improving the integrity of the interfacial silicon oxide helps improve the chemical passivation effect of the surfaces.

In the prior arts, the preparation flow of the TOPCon cells is as follows: cleaning and texturing-diffusing boron emitter-etching-preparing $SiO_2$ on back side-preparing heavily-doped polycrystalline silicon by plasma enhanced chemical vapor deposition (PECVD)—high-temperature annealing-front surface aluminum oxide and $Si_3N_4$-screen printing. For the tunnel silicon oxide passivated contact technology, its electron collection is carried out by n-type phosphor-doped polycrystalline silicon film, and hole collection is carried out by p-type boron-doped polycrystalline silicon film. Due to better effect, the n-type passivated contact technology has been widely accepted as a next-generation industrial efficient crystalline silicon cell technology. However, the n-TOPCon cells are difficult to manufacture in large scale due to high costs. While the p-TOPCon technology can be compatible with aluminum paste material to reduce the costs. Therefore, it is practically significant to develop and improve the p-TOPCon technology.

The Chinese invention patent CN105742391A discloses a tunnel SiON passivated contact solar cell and a preparation method thereof. The preparation method is a plasma-assisted nitrous oxide oxidation method, which specifically includes: performing oxidation treatment on silicon surfaces by using PECVD. Since the reaction gas contains N element, a nitrogen-containing ultrathin silicon oxide layer, i.e. SiON film, is generated during this process. However, the silicon oxide layer prepared by directly using the plasma-assisted nitrous oxide oxidation method has two prominent problems: firstly, due to the relatively low nitrogen concentration in the SiON film, the effect of stopping boron diffusion and enrichment cannot be achieved; secondly, the direct action of the plasma on the surfaces of the silicon wafer may introduce noticeable ion bombardment damage defects. The above problems can affect the passivation effect of the silicon oxide layer on the silicon wafer. The optimal passivation effect achieved with the p-TOPCon prepared utilizing the nitrogen-doped ultrathin silicon oxide layer results in an implied open-circuit voltage (iVoc) of 700 mV to 705 mV.

SUMMARY

For the shortcomings of the prior arts, the technical problem to be actually solved by the present disclosure is how to improve the passivation effect of TOPCon.

In order to solve the above technical problems, a first aspect of the present disclosure provides an ultrathin SiON interface material, and the ultrathin SiON interface material provided by is an SiON film with a thickness of 1 nm to 4 nm, and a percentage content of N atoms in the SiON film is 1% to 40%.

The ultrathin SiON interface material of the present disclosure has the characteristics of high nitrogen content. Compared with silicon oxide, the diffusion rate of boron in the SiON film is low, which effectively reduces the damaging effect of boron on the SiON film, improves the integrity of the SiON film and maintains the chemical passivation effect. The SiON film with high nitrogen concentration can noticeably lower the concentration of boron on the silicon surface so as to lessen the boron-induced defects. Furthermore, the SiON film has an energy band structure approximate to silicon nitride and has a small valence band offset, which helps hole transport, increases the hole transport efficiency and hole selectivity, and further improves the passivation quality and reduces the contact resistivity.

A second aspect of the present disclosure provides a preparation method of the above ultrathin SiON interface material, which includes the following steps:

at step S1, growing a layer of $SiO_2$ film on a silicon wafer by ion-free bombardment oxidation method;

at step S2, performing surface nitriding treatment on the $SiO_2$ film in the plasma enhanced chemical vapor deposition (PECVD) with a nitrogen-containing gas and an oxygen-containing gas filled treatment atmosphere to generate an SiON film.

In the preparation method, a silicon oxide layer free from bombardment damage is firstly grown on a silicon wafer, which significantly reduces the ion bombardment damage introduced by the plasma nitriding process so as to increase the passivation quality. This method effectively reduces the interface state defects. The interface state obtained by the conventional plasma nitrous oxide oxidation method is usually $2*10^{12}$ eV*cm$^{-2}$. When the preparation method of the present disclosure is used, the density of the defect state can be decreased to $0.4*10^{12}$ eV*cm$^{-2}$.

Preferably, in the step S2, the nitrogen-containing gas is $NH_3$, and the oxygen-containing gas is $N_2O$. Surface nitriding treatment is performed using $NH_3$ and $N_2O$. On one hand, the increased N concentration during the decomposition of $NH_3$ can obviously introduce N element while generating H atoms, etching silicon oxide; on the other hand, the introduction of $N_2O$ can supplement oxygen source to maintain the thickness of the SiON film, avoiding excessively small thickness resulting from the etching effect of H ions.

Preferably, in the step S2, a flow ratio of the nitrogen-containing gas to the oxygen-containing gas ranges from 2:1 to 8:1.

Preferably, in the step S1, the ion-free bombardment oxidation method is an ozone oxidation method or a nitric acid oxidation method.

In the method of the present disclosure, the thickness of silicon oxide and the mixing ratio of $NH_3$ to $N_2O$ can be adjusted based on actual requirements, so as to adjust the thickness and the composition of the SiON film.

A third aspect of the present disclosure provides a tunnel oxide passivated structure, which includes a silicon wafer, a passivation tunneling layer and a doped polycrystalline silicon layer, and a material of the passivation tunneling layer is the ultrathin SiON interface material mentioned above, and the passivation tunneling layer is located between the silicon wafer and the doped polycrystalline silicon layer.

Preferably, a material of the doped polycrystalline silicon layer is a boron-doped amorphous silicon film.

In the tunnel oxide passivated structure of the present disclosure, the ultrathin SiON interface material is used as the passivation tunneling layer to reduce the damaging effect of the boron on the tunnel oxide layer, increase the passivation quality, reduce the contact resistivity and achieve excellent contact performance. The tunnel oxide passivated structure is applied to p-TOPCon and the iVoc can reach above 720 mV, with the contact resistivity less than 5 m$\Omega$cm$^2$.

A fourth aspect of the present disclosure provides a preparation method of the above tunnel oxide passivated structure, which includes the following steps:

at step S1, growing a layer of $SiO_2$ film on a silicon wafer by ion-free bombardment oxidation method;

at step S2, performing surface nitriding treatment on the $SiO_2$ film in the plasma enhanced chemical vapor deposition (PECVD) with a nitrogen-containing gas and an oxygen-containing gas filled treatment atmosphere to generate an SiON film;

at step S3, depositing a boron-doped amorphous silicon film on the SiON film by PECVD method;

at step S4, performing annealing treatment to obtain the tunnel oxide passivated structure.

The preparation method is easy to operate and can be compatible with the existing mass production equipment technology and especially with PECVD equipment. The used gas consumables are low in costs, hardly increasing the costs of the consumables.

Preferably, in the step S4, an annealing temperature ranges from 820° C. to 1100° C.

The silicon oxynitride has higher thermal stability than silicon oxide and can bear higher-temperature and faster temperature-changing annealing treatment. Based on actual requirements, the thickness of silicon oxide and the mixing ratio of the nitrogen-containing gas to the oxygen-containing gas can be adjusted so as to adjust the thickness and the composition of the SiON film and thus match different high-temperature annealing temperatures.

A fifth aspect of the present disclosure provides an application of the above tunnel oxide passivated structure. The tunnel oxide passivated structure is applied to the n-TOPCon and p-TOPCon solar cells.

BRIEF DESCRIPTIONS OF THE DRAWINGS

DETAILED DESCRIPTIONS OF THE EMBODIMENTS

Figure 1:
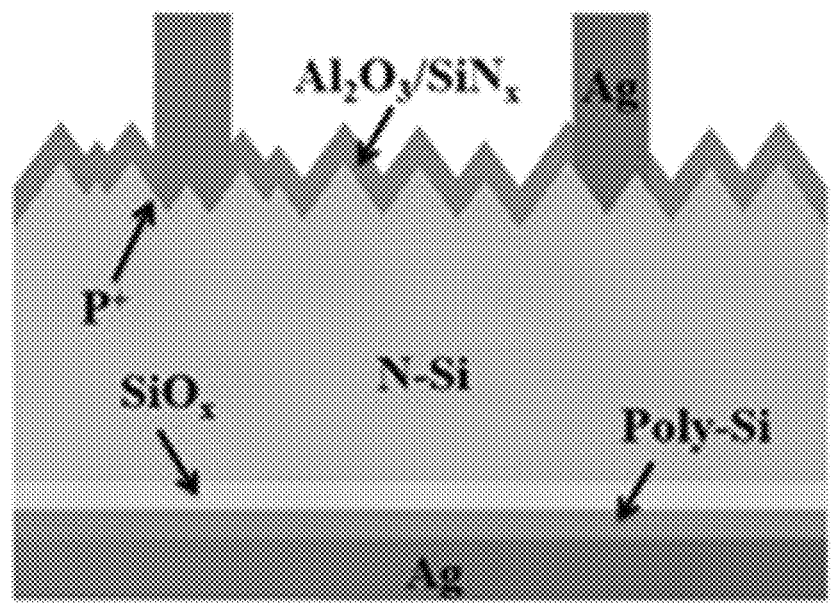
FIG. 1 is a structural diagram of a tunnel oxide passivated contact solar cell.

In order to make the above objects, features and advantages of the present disclosure clearer and more intelligible, the specific embodiments of the present disclosure will be further detailed below in combination with drawings. It should be noted that the embodiments below are used only to describe the implementation methods and typical parameters of the present disclosure rather than to limit the parameter scope of the present disclosure. Any reasonable changes derived herefrom can still fall within the scope of protection of the claims of the present disclosure.

It is noted that the endpoints and any values of the ranges disclosed herein are not limited to the accurate ranges or values. These ranges and values should be understood as including values approximate to these ranges and values. For numerical ranges, combination can be performed between endpoint values of each range, between an endpoint value and an individual point value of each range or between individual point values to obtain one or more new numerical ranges. These numerical ranges should be regarded as specifically disclosed herein.

An embodiment of the present disclosure provides a tunnel oxide passivated structure, which includes a silicon wafer, a passivation tunneling layer and a doped polycrystalline silicon layer, and a material of the passivation tunneling layer is an ultrathin SiON interface material, and the passivation tunneling layer is located between the silicon wafer and the doped polycrystalline silicon layer. The ultrathin SiON interface material is an SiON film with a thickness of 1 nm to 4 nm, and the percentage content of N atoms in the SiON film ranges from 1% to 40%.

The tunnel oxide passivated structure may be applied to N-type or P-type tunnel oxide passivated contact solar cells. When it is applied to the p-TOPCon, the material of the doped polycrystalline silicon layer is a boron-doped amorphous silicon film. The SiON interface material with high nitrogen content helps increase the passivation quality of the p-TOPCon based on the principle: 1) compared with silicon oxide, the diffusion rate of the boron in the SiON film is low, which effectively reduces the damaging effect of the boron on the SiON film, improves the integrity of the SiON film and maintains the chemical passivation effect; 2) the SiON film with high nitrogen concentration can noticeably lower the concentration of boron on the silicon surface so as to lessen the boron-induced defects; 3) the SiON film has an energy band structure approximate to silicon nitride and has a small valence band offset, which helps hole transport, increases the hole transport efficiency and hole selectivity, and further improves the passivation quality and reduces the contact resistivity. The iVoc of the P-type TOPCon can reach above 720 mV, with the contact resistivity less than 5 m$\Omega$cm$^2$.

An embodiment of the present disclosure further provides a preparation method of the above tunnel oxide passivated structure, which includes the following steps:

at step S1, growing a layer of $SiO_2$ film on a silicon wafer by ion-free bombardment oxidation method;

at step S2, performing surface nitriding treatment on the $SiO_2$ film in the plasma enhanced chemical vapor deposition (PECVD) with a nitrogen-containing gas and an oxygen-containing gas filled treatment atmosphere to generate an SiON film;

at step S3, depositing a boron-doped amorphous silicon film on the SiON film by PECVD method;

at step S4, performing annealing treatment to obtain the tunnel oxide passivated structure.

In a specific embodiment of the present disclosure, in the step S1, the ion-free bombardment oxidation method is an ozone oxidation method or a nitric acid oxidation method, and preferably the ozone oxidation method; in the step S2, the nitrogen-containing gas is $NH_3$ and the oxygen-containing gas is $N_2O$; a flow ratio of the nitrogen-containing gas to the oxygen-containing gas ranges from 2:1 to 8:1; in the step S3, an annealing temperature ranges from 820° C. to 1100° C.

The present disclosure will be detailed below by way of specific embodiments. In the following embodiments and comparative embodiments, the silicon wafer is an N-type monocrystalline silicon wafer of 160 μm, which is chemically polished on both sides, with the resistivity being 0.852 cm. The passivated structure adopted by the following embodiments and comparative embodiments is a double-sided p-type tunnel silicon oxide passivated structure.

Embodiment 1

Figure 2:
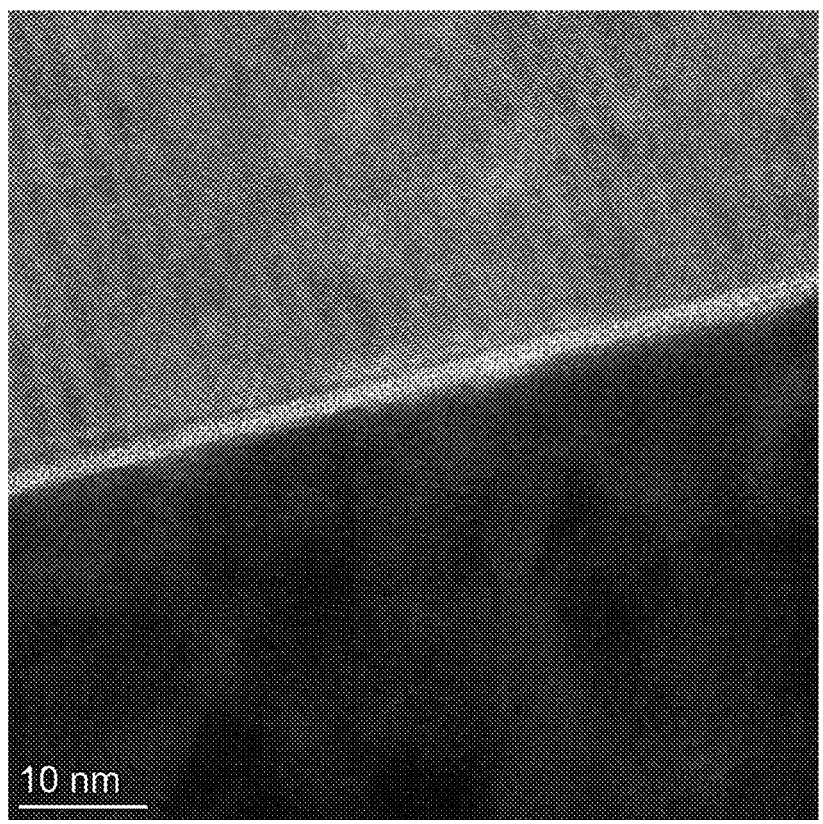
FIG. 2 is a micro-structure of an SiON film in embodiment 1.

In this embodiment, a tunnel oxide passivated structure is prepared, which includes the following steps:

(1) a silicon wafer was cut into a size of 4 cm×4 cm and subjected to standard RCA cleaning;

(2) the silicon wafer was placed in an ozone generator to grow a layer of $SiO_2$ film of about 1.5 nm;

(3) a sample was placed into PECVD and treated in a treatment atmosphere of $N_2O$ and $NH_3$ to generate an SiON film, and the flow ratio of $N_2O$ to $NH_3$ was 4:1, the power was 5 W, the treatment time was 300 s; the thickness of the SiON film was 1.7 nm, with its microstructure shown in FIG. 2;

(4) a boron-doped amorphous silicon film was respectively deposited on both sides of the silicon wafer by PECVD;

(5) the sample was placed into a tubular annealing furnace for annealing of 30 min at an annealing temperature of 880° C. to 1000° C.

Embodiment 2

In this embodiment, a tunnel oxide passivated structure is prepared, which includes the following steps:

(1) a silicon wafer was cut into a size of 4 cm×4 cm and subjected to standard RCA cleaning;

(2) the silicon wafer was placed in an ozone generator to grow a layer of $SiO_2$ film of about 1.5 nm;

(3) a sample was placed into PECVD and treated in a treatment atmosphere of $N_2O$ and $NH_3$ to generate an SiON film, and the flow ratio of $N_2O$ to $NH_3$ was 2:1, the power was 5 W, the treatment time was 300 s;

(4) a boron-doped amorphous silicon film was respectively deposited on both sides of the silicon wafer by PECVD;

(5) the sample was placed into a tubular annealing furnace for annealing of 30 min at an annealing temperature of 880° C. to 1000° C.

Embodiment 3

In this embodiment, a tunnel oxide passivated structure is prepared, which includes the following steps:

(1) a silicon wafer was cut into a size of 4 cm×4 cm and subjected to standard RCA cleaning;

(2) the silicon wafer was placed in an ozone generator to grow a layer of $SiO_2$ film of about 1.5 nm;

(3) a sample was placed into PECVD and treated in a treatment atmosphere of $N_2O$ and $NH_3$ to generate an SiON film, and the flow ratio of $N_2O$ to $NH_3$ was 8:1, the power was 5 W, the treatment time was 300 s;

(4) a boron-doped amorphous silicon film was respectively deposited on both sides of the silicon wafer by PECVD;

(5) the sample was placed into a tubular annealing furnace for annealing of 30 min at an annealing temperature of 880° C. to 1000° C.

Comparative Embodiment 1

In this comparative embodiment, a tunnel oxide passivated structure is prepared, which includes the following steps:

(1) a silicon wafer was cut into a size of 4 cm×4 cm and subjected to standard RCA cleaning;

(2) the silicon wafer was placed in nitric acid to form an $SiO_2$ film;

(3) after the silicon wafer is cleaned and dried, a boron-doped amorphous silicon film was deposited respectively on both sides of the silicon wafer by PECVD;

(4) the sample was placed into a tubular annealing furnace for annealing of 30 min at an annealing temperature of 880° C. to 1000° C.

Comparative Embodiment 2

In this comparative embodiment, a tunnel oxide passivated structure is prepared, which includes the following steps:

(1) a silicon wafer was cut into a size of 4 cm×4 cm and subjected to standard RCA cleaning;

(2) the silicon wafer was placed into PECVD and treated in a treatment atmosphere of $N_2O$ and $NH_3$ to generate an SiON film, and the flow ratio of $N_2O$ to $NH_3$ was 2:1, the power was 5 W, the treatment time was 300 s;

(3) after the silicon wafer is cleaned and dried, a boron-doped amorphous silicon film was deposited respectively on both sides of the silicon wafer by PECVD;

(4) the sample was placed into a tubular annealing furnace for annealing of 30 min at an annealing temperature of 880° C. to 1000° C.

By using the X-ray photoelectron spectroscopy, the composition of the passivation tunneling layer in the tunnel oxide passivated structure in the embodiment and comparative embodiment is analyzed, with an analysis result shown in Table 1 below:

TABLE 1

Contents of Si, O and N in the passivated tunneling layer

| Composition | Content percentage of Si atoms | Content percentage of O atoms | Content percentage of N atoms |
|---|---|---|---|
| Embodiment 1 | 50.74 | 43.59 | 5.67 |
| Embodiment 2 | 50.68 | 38.94 | 10.38 |

TABLE 1-continued

Contents of Si, O and N in the passivated tunneling layer

| Composition | Content percentage of Si atoms | Content percentage of O atoms | Content percentage of N atoms |
|---|---|---|---|
| Embodiment 3 | 49.67 | 47.59 | 2.74 |
| Comparative Embodiment 1 | 51.65 | 48.25 | 0.1 |
| Comparative Embodiment 2 | 50.31 | 48.93 | 0.76 |

The tunnel oxide passivated structure for testing passivation performance in the embodiments and comparative embodiments has the following passivation performance results shown in Table 2 below:

TABLE 2

Passivation performance of the tunnel oxide passivated structure

| Annealing temperature | Embodiment 1 | Embodiment 2 | Embodiment 3 | Comparative Embodiment 1 | Comparative Embodiment 2 |
|---|---|---|---|---|---|
| 880° C. | 717 mV | 713 mV | 710 mV | 678 mV | 612 mV |
| 920° C. | 720 mV | 715 mV | 713 mV | 694 mV | 664 mV |
| 980° C. | 726 mV | 722 mV | 708 mV | 653 mV | 698 mV |
| 1000° C. | 696 mV | 687 mV | 623 mV | 612 mV | 662 mV |

From the test result, it can be known that the passivation performance of the tunnel oxide passivated structure prepared in the embodiments 1 to 3 is superior to those of the comparative embodiments 1 to 2. With the proper annealing temperature, the passivation effect of the embodiments 1 to 3 can enable the iVoc to be above 720 mV. The back contact cells prepared by the process of the embodiment 1 can have the efficiency of up to 22.04%.

Although the present disclosure is made as above, the present disclosure is not limited hereto. Any persons of skill in the arts can make various changes and modifications without departing from the spirit and scope of the present disclosure, and thus the scope of protection of the present disclosure shall be referred to the scope defined in the claims.

What is claimed is:

1. A preparation method of an ultrathin silicon oxynitride interface material,
   wherein the ultrathin silicon oxynitride interface material is a single SiON film with a thickness of 1 nm to 4 nm, and a percentage content of N atoms in the single SiON film ranges from 1% to 40%;
   wherein the preparation method comprises:
   step S1, growing a layer of an $SiO_2$ film on a silicon wafer by an ion-free bombardment oxidation method;
   step S2, performing a surface nitriding treatment on the $SiO_2$ film in a plasma enhanced chemical vapor deposition (PECVD) with a nitrogen-containing gas and an oxygen-containing gas filled treatment atmosphere to convert the $SiO_2$ film to the single SiON film.

2. The preparation method of the ultrathin silicon oxynitride interface material according to claim 1, wherein in the step S2, the nitrogen-containing gas is $NH_3$, and the oxygen-containing gas is $N_2O$.

3. The preparation method of the ultrathin silicon oxynitride interface material according to claim 1, wherein in the step 2, a flow ratio of the nitrogen-containing gas to the oxygen-containing gas ranges from 2:1 to 8:1.

4. The preparation method of the ultrathin silicon oxynitride interface material according to claim 1, wherein in the step S1, the ion-free bombardment oxidation method is an ozone oxidation method or a nitric acid oxidation method.

5. An ultrathin silicon oxynitride interface material prepared by the preparation method according to claim 1.

6. A preparation method of a tunnel oxide passivated structure,
   wherein the tunnel oxide passivated structure comprises:
   a silicon wafer;
   a doped polycrystalline silicon layer; and
   a passivation tunneling layer, wherein the passivation tunneling layer is located between the silicon wafer and the doped polycrystalline silicon layer, a material of the passivation tunneling layer is a single SiON film with a thickness of 1 nm to 4 nm, and a percentage content of N atoms in the single SiON film ranges from 1% to 40%;
   wherein the preparation method comprises:
   step S1, growing a layer of an $SiO_2$ film on the silicon wafer by an ion-free bombardment oxidation method;
   step S2, performing a surface nitriding treatment on the $SiO_2$ film in a PECVD method with a nitrogen-containing gas and an oxygen-containing gas filled treatment atmosphere to convert the $SiO_2$ film to the single SiON film;
   step S3, depositing a boron-doped amorphous silicon film on the single SiON film by the PECVD method;
   step S4, performing an annealing treatment to obtain the tunnel oxide passivated structure.

7. The preparation method of the tunnel oxide passivated structure according to claim 6, wherein in the step S4, an annealing temperature ranges from 820° C. to 1100° C.

8. A tunnel oxide passivated structure prepared by the preparation method according to claim 6, wherein the tunnel oxide passivated structure is applied to N-type or P-type tunnel oxide passivated contact solar cells.

* * * * *